US010896812B2

(12) United States Patent
Pasquariello et al.

(10) Patent No.: US 10,896,812 B2
(45) Date of Patent: Jan. 19, 2021

(54) SPUTTERING TARGET HAVING RFID INFORMATION

(71) Applicant: MATERION CORPORATION, Mayfield Heights, OH (US)

(72) Inventors: Michael V. Pasquariello, Naugatuck, CT (US); Thomas P. St. Vincent, Ridgefield, CT (US); Matthew T. Willson, New Milford, CT (US); Richard J. Koba, Saugus, MA (US)

(73) Assignee: MATERION CORPORATION, Mayfield Heights, OH (US)

( * ) Notice: Subject to any disclaimer, the term of this patent is extended or adjusted under 35 U.S.C. 154(b) by 290 days.

(21) Appl. No.: 15/877,430

(22) Filed: Jan. 23, 2018

(65) Prior Publication Data

US 2018/0211825 A1    Jul. 26, 2018

Related U.S. Application Data

(60) Provisional application No. 62/450,316, filed on Jan. 25, 2017.

(51) Int. Cl.
| *C23C 14/34* | (2006.01) |
| *H01J 37/34* | (2006.01) |
| *H01J 37/32* | (2006.01) |
| *G06K 19/077* | (2006.01) |

(52) U.S. Cl.
CPC ...... *H01J 37/3405* (2013.01); *C23C 14/3407* (2013.01); *G06K 19/07758* (2013.01); *H01J 37/32935* (2013.01); *H01J 37/3417* (2013.01); *H01J 37/3435* (2013.01); *H01J 37/3476* (2013.01); *H01J 37/3491* (2013.01); *G06K 19/07749* (2013.01); *G06K 19/07773* (2013.01)

(58) Field of Classification Search
CPC .......................... H01J 37/3435; H01J 37/3476
See application file for complete search history.

(56) References Cited

U.S. PATENT DOCUMENTS

| 2009/0090620 A1 | 4/2009 | Pavloff | |
| 2009/0225415 A1* | 9/2009 | Hughes | B01L 3/545 |
| | | | 359/396 |
| 2015/0262798 A1* | 9/2015 | Binns | H01J 37/3414 |
| | | | 204/298.03 |

FOREIGN PATENT DOCUMENTS

| WO | WO 93/10276 A1 | 5/1993 |
| WO | WO 2015/183554 A1 | 12/2015 |

OTHER PUBLICATIONS

International Search Report for PCT Application No. PCT/US18/14762 dated May 29, 2018.

* cited by examiner

*Primary Examiner* — Jason Berman
(74) *Attorney, Agent, or Firm* — Cozen O'Connor (57) ABSTRACT

A method for affixing an RFID tag to sputtering targets is disclosed. A cavity is formed on the back of the backing plate adjacent to the outer edge. Within the cavity, an RFID tag is secured with an encapsulant. The encapsulant is cured with the RFID tag capable of communicating with an associated reader through the encapsulant.

8 Claims, 5 Drawing Sheets

SPUTTERING TARGET HAVING RFID INFORMATION

CROSS-REFERENCE TO RELATED APPLICATIONS

The present application claims priority to U.S. Provisional Patent Application Ser. No. 62/450,316, filed Jan. 25, 2017, and titled "Method for Affixing an RFID Tag to a Sputtering Target," the entire disclosure of which is incorporated by reference herein.

BACKGROUND

The present disclosure relates to sputtering targets used for making thin films of various materials. In particular, the present disclosure relates to a sputtering target and method for affixing a radio frequency identification ("RFID") tag to a backing plate of the sputtering target.

Sputtering is a process used to deposit a thin layer of material onto a substrate. During the sputtering process, the substrate and a sputtering target are placed in a deposition chamber. The sputtering target, typically a metal, metal alloy, or ceramic material, is constructed of the material to be sputtered. The sputtering target and the substrate are placed in proximity to one another within the chamber and the target is bombarded with positively charged ions such as ionized argon. The high energy ions cause atoms on the surface of the sputtering target to be ejected and deposited on the surface of the substrate.

Figure 1A:
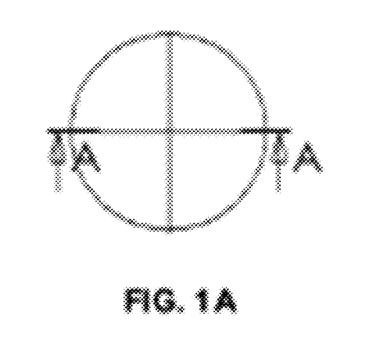
FIG. 1A is a top view of a conventional planar sputtering target.
Figure 1B:
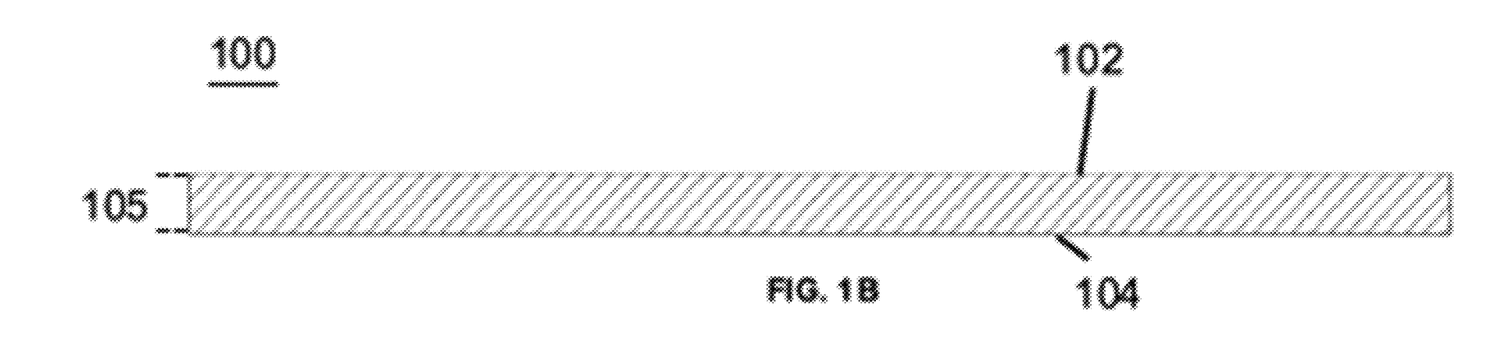
FIG. 1B is a cross sectional view of FIG. 1A through line A-A.

FIG. 1 is representative of a conventional planar sputtering target. FIG. 1A is a top view of the planar sputtering target, while FIG. 1B is a cross sectional view of FIG. 1A. As seen in FIG. 1B, the sputtering target 100 has a regular thickness 105 through the entire cross-section. Also, the upper surface 102 and the lower surface 104 are planar.

In magnetron sputtering systems, material is sputtered under vacuum from the surface of a sputtering target assembly by argon ions and deposited onto a substrate material. The entire assembly is typically water cooled, and in many systems, the sputtering target assembly acts as a material source, a vacuum seal, and a conduit for heat transfer.

During magnetron sputtering, the argon ions that do the sputtering are formed in a plasma above the surface of the sputtering target. To enhance sputtering, the plasma is constrained by an engineered magnetic field that is projected above the sputtering target surface. However, this constraint of the plasma results in sputtering only occurring from a relatively small area of the target surface, resulting in the formation of a so-called "sputter groove" or "sputter racetrack." The useful life of the sputtering target is typically determined by the characteristics of this sputter groove, as beyond a certain groove depth, the deposition rate and/or uniformity of the material ejected from the sputtering target onto the substrate is compromised. Depending on the cathode design, as little as 20-30% of the actual target material is consumed before the end of target life. For high cost target materials such as precious metals, this low target utilization is particularly problematic.

One way of reducing the amount of high cost materials in sputtering target assemblies is to bond the sputtering target to a backing plate made of a less expensive material such as a copper alloy. The backing plate serves as a structural member, maintaining the vacuum seal to the cathode, and allows one to limit the actual target materials used to a thickness only slightly larger than the maximum allowable sputter groove depth.

Monitoring the remaining life of sputtering targets, or ensuring that the correct target is used in the physical vapor deposition (PVD) machine, is an ongoing issue. The incorrect target may damage the machine, while almost spent targets may result in great variations in the material sputtered to a substrate. Furthermore, sputtering targets may be rated for certain power applications, which may be different from those offered by the chamber of the PVD machine into which it is inserted. If incorrect power is used, the deposition resulting from use of the sputtering target may fall below acceptable parameters, or the sputtering target itself may be damaged.

RFID tags, in general, have been in use since at least the early 1970's, and have now become more prevalent as the cost to produce such tags has been substantially reduced. RFID tags were originally one of two types, inductively coupled (metal coils in the tag receive power from an electromagnetic field generated by an RFID reader), or capacitively coupled (conductive carbon ink printed on the tag receive power from the electromagnetic field). Advances in materials science have resulted in the current, three-basic types of RFID tags, active, semi-active, and passive. Active and semi-active include integrated batteries, whereas a passive tag is dependent upon a reader to provide power to activate.

Currently RFID tags, regardless of whether active, semi-active, or passive, generally all work in the same manner, i.e., data is stored within a microchip waiting to be read, the tag's antenna receives electromagnetic energy from a reader antenna, using internal power (active) or from the field (semi-active/passive), the tag sends radio signals back to the reader, and the reader receives the tag's signal and processes the data. Active and semi-active tags both use internal batteries for powering their circuits, the difference being active tags also use internal batteries to power their transmitter and semi-active tags use the field to generate transmitter power. Generally speaking, active tags are used for large, expensive items/machines and passive tags (commonly disposable) are used on less expensive items, e.g., DVDs, grocery products, etc.

RFID tags contain memory for storing data, and have three different storage types: Read-Write, Read-only, and Write once, read many (WORM). As the names imply, Read-Write can be read and written multiple times, Read-only may only be read (only store data written on them when manufactured), and Write-once read many can be written one time (written once after manufacture, e.g., adding a serial number in addition to the data written at manufacture) and read many times thereafter.

Current attempts at affixing RFID tags to sputtering targets involve a costly and time consuming processing utilizing a metal plug to which the RFID tag is affixed. This plug is then inserted into a slot on the rear (bottom) of the backing plate of the target using a O-ring or other seal. The plug requires machining to exact tolerances in order to properly insert into the backing plate, and must be of a suitable metal so as to allow transmission of signals to and from the RFID tag.

It would be desirable to provide a low-cost, faster method for affixing RFID tags to sputtering targets without degrading the signal transmissions therefrom.

BRIEF DESCRIPTION

The present disclosure relates to sputtering targets to which are affixed radio frequency identification ("RFID") tags. Such targets meet a current need in the marketplace that is not met by other commercially available sputtering targets. The sputtering targets of the present disclosure utilize an epoxy-based mechanism for affixing RFID tags to the backing plate of a sputtering target, positioned so as to communicate with a corresponding RFID reader.

According to one embodiment, there is provided a method for affixing an RFID tag to a sputtering target. An RFID tag is positioned in a cavity located adjacent an outer circumference of a bottom of the backing plate of the sputtering target, the RFID tag centered within both X and Y dimensions of the cavity. An epoxy is then applied to the cavity, with the RFID tag positioned therein. Thereafter, the epoxy is cured to substantially encapsulate the RFID tag.

In accordance with another embodiment, there is provided a sputtering target that includes a backing plate including a cavity and an RFID tag positioned within the cavity.

In another embodiment, there is provided a backing plate for a sputtering target. The backing plate includes a cavity formed adjacent an outer circumference of a bottom thereof, and an RFID tag positioned on a bottom of the cavity, the RFID tag centered therein.

In still another embodiment, there is provided a vapor deposition system. The system includes a vapor deposition machine having a deposition chamber, and a control system configured to control operations of the vapor deposition machine. The system further includes a radio frequency identification reader disposed in the deposition chamber and communicatively coupled to the control system, and a sputtering target located in the deposition chamber, the sputtering target comprising an encapsulant substantially encapsulating an RFID tag within a cavity formed on a backing plate thereof.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

A more complete understanding of the articles/devices, processes and components disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The terms "about" and "approximately" can be used to include any numerical value that can vary without changing the basic function of that value. When used with a range, "about" and "approximately" also disclose the range defined by the absolute values of the two endpoints, e.g. "about 2 to about 4" also discloses the range "from 2 to 4." Generally, the terms "about" and "approximately" may refer to plus or minus 10% of the indicated number.

The term "coplanar" is used herein in the lay sense to refer generally to two components being on a common level, and should not be construed in a strict mathematical sense. The term "planar" or "flat" is also used in the lay sense, not in a strict mathematical sense.

As used herein, the term "encapsulant" refers to any epoxy, adhesive, glue, resin, or other material that solidifies or hardens when cured, including materials that solidify or harden when exposed to a source of ultraviolet radiation with an intensity and wavelength predefined; materials that cure when heated to a particular temperature; single or multiple stage materials (e.g. resin and catalyst), and the like.

As used herein, the term "RFID" is used to refer to self-contained electronic circuits known as radio-frequency identification tags that may store and/or transmit data. The term "RFID tag" covers, for example, tags incorporating a battery (self-powered) and tags requiring an external power source.

The present disclosure relates to sputtering targets to which are affixed RFID tags. The sputtering targets can be described with a backing plate (described below) into which an RFID tag is incorporated for coating wafers that range from 150 mm diameter to 450 mm diameter. In one embodiment, the sputtering target to which an RFID tag is affixed is used for coating wafers that range from 200 mm to 300 mm.

In this regard, sputtering is a process used to deposit a thin layer of material onto a substrate. During the sputtering process, the substrate and a sputtering target are placed in a deposition chamber. The sputtering target is constructed of the material to be sputtered. The sputtering target and the substrate are placed in proximity to one another within the chamber and the target is bombarded with positively charged ions such as ionized argon. The high energy ions cause atoms on the surface of the sputtering target to be ejected and deposited on the surface of the substrate.

Sputtering targets can have several different shapes. As previously discussed, FIG. 1A and FIG. 1B are representative of a conventional planar sputtering target. FIG. 1A is a top view of the planar sputtering target, which has a circular perimeter. FIG. 1B is a cross sectional view of FIG. 1A. As seen in FIG. 1B, the sputtering target 100 has a regular thickness 105 through the entire cross-section. Also, the upper surface 102 and the lower surface 104 are planar.

Figure 2:
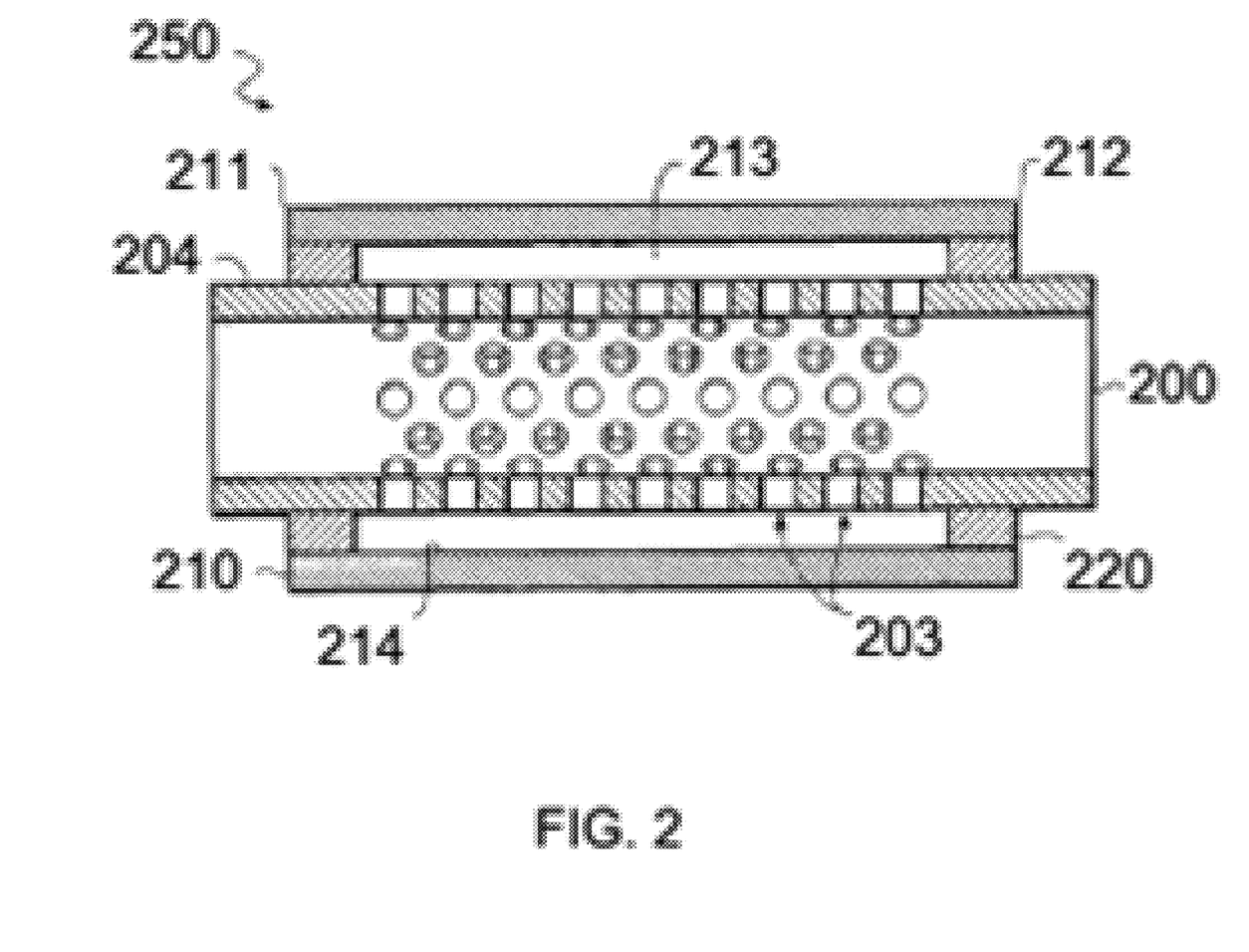
FIG. 2 is a cross-sectional view of a rotary sputtering target.

FIG. 2 is a cross-sectional view of a rotary sputtering target. A rotary sputtering target assembly 250 has a first end 211 and a second end 212. The assembly includes a gap 213 of uniform depth between a backing tube 200 and a sputtering target 210 of the desired material to be sputtered as a thin film onto the surface of a substrate. The backing tube 200 may contain perforations 203 that allow for a liquid or gaseous cooling fluid during the sputtering operation to contact directly the inner surface 214 of the sputtering target 210 by flowing into and through gap 213. To form the gap 213, a discontinuous bonding material 220 located only at the ends of target 210 is of a length sufficient to affix the target rigidly in position to the backing tube so as not to become distorted during sputtering, yet forming a layer of sufficient thickness to contain the gap 213 at its optimum and uniform depth. The exposed end portions 204 of the backing tube in the rotary sputtering target assembly 250 provide the means for attachment of the target assembly to a sputtering system, and have a configuration appropriate for such attachment and for connection to the cooling fluid source. This sputtering target 210 has a structure of a tube.

Figures 3A, 3B:
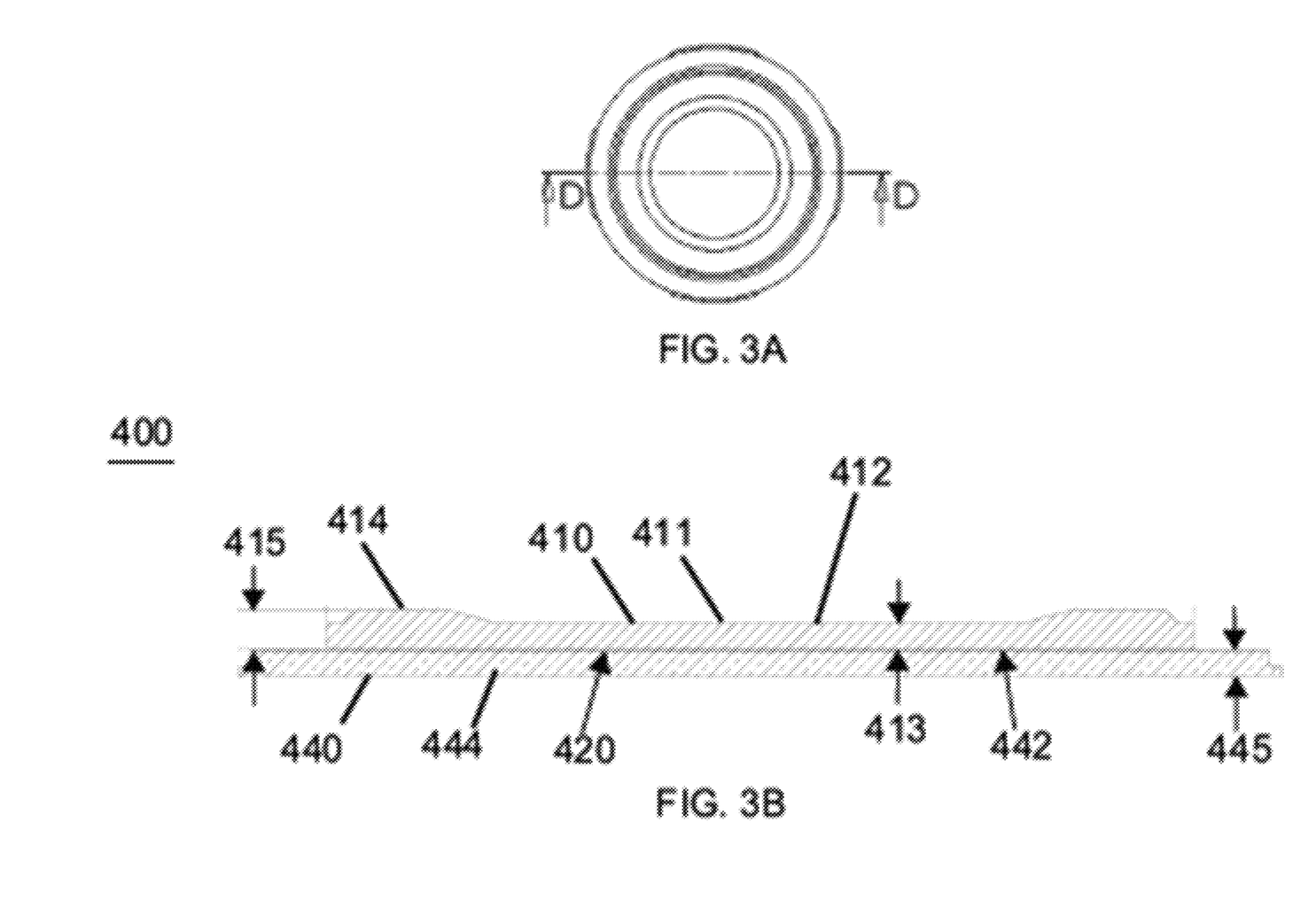
FIG. 3A is a top view of a standard sputtering target design attached to a backing plate.
FIG. 3B is a cross sectional view of FIG. 3A through line D-D.

FIG. 3A and FIG. 3B are views of a third form of a sputtering target assembly 400. The assembly is formed from a sputtering target 410, a backing plate 440, and a bonding layer (not visible) joining the sputtering target to the backing plate 440.

As illustrated here, the sputtering target 410 has an upper surface 411 and a lower surface 420. Here, the upper surface 411 is sculpted, with a generally flat central area 412 and a "racetrack" enhancement 414 around an outer perimeter. The lower surface 420 is flat or planar. As a result, the thickness 413 of the central area is less than the thickness 415 of the racetrack. This "enhanced" structure may be desirable because in some circumstances, sputtering only occurs from a relatively small area of the target surface, resulting in the formation of a so-called "sputter groove" or "sputter racetrack" in the wear profile of the sputtering target. Thus, material can be removed from the regions of the sputtering target surface where sputtering does not occur, leaving behind enhanced (or raised) areas where the sputtering predominantly occurs.

The backing plate 440 serves as a structural member. The backing plate 440 has a flat upper surface 442 and a flat lower surface 444. The thickness 445 of the backing plate 440 is generally regular from the center to the outer perimeter. The bonding layer can be any suitable material for joining the two components together, such as indium solder.

Figure 4A:
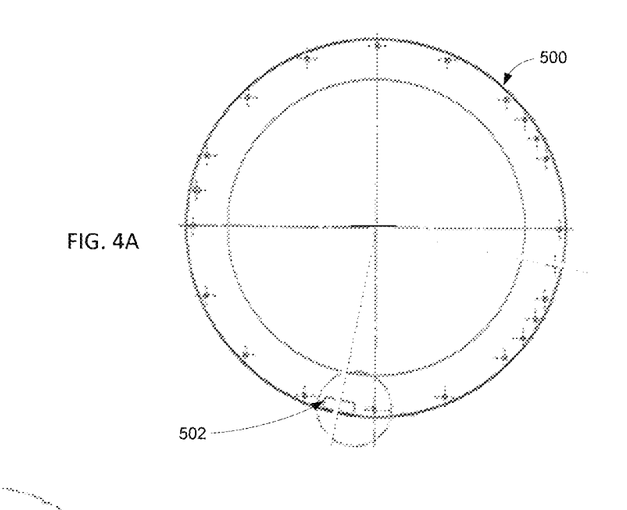
FIG. 4A is a bottom view of a backing plate of a conventional planar sputtering target.

Turning now to FIG. 4A, there is shown a bottom view of a backing plate 500 of a conventional planar sputtering target. As illustrated in FIG. 4A, the backing plate 500 includes a slot or cavity 502 positioned adjacent the outer circumference of the backing plate 500. In accordance with one embodiment, the cavity 502 is a cavity in the backing plate into which an RFID tag 504 is positioned, as shown in the magnified view thereof in FIG. 4B and the cross sectional view of FIG. 4C. In such an embodiment, the RFID tag 504 is positioned in the cavity 502 with an air gap of at least 2-3 mm in the X and the Y directions. The RFID tag 504 is secured to the metal of the backing plate within the cavity 502 using any suitable means including, for example and without limitation, adhesive, tape, expandable encapsulant, or other suitable encapsulating means to maintain the position of the RFID tag 504 within the cavity 502, as well as to enable the RFID tag 504 to remain in close proximity or touching the metal of the backing plate 500. It will be appreciated that in certain embodiments, the RFID tag 504 may utilize the metal of the backing plate 500 as an extension of the RFID tag 504 antenna, as will be understood in the art.

Figure 4B:
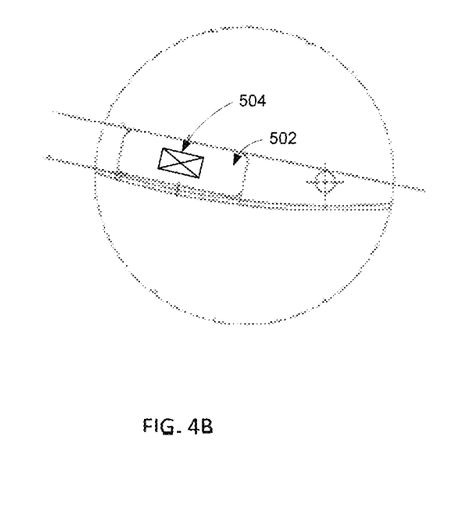
FIG. 4B is a magnified view of the cavity and tag of FIG. 4A.
Figure 4C:
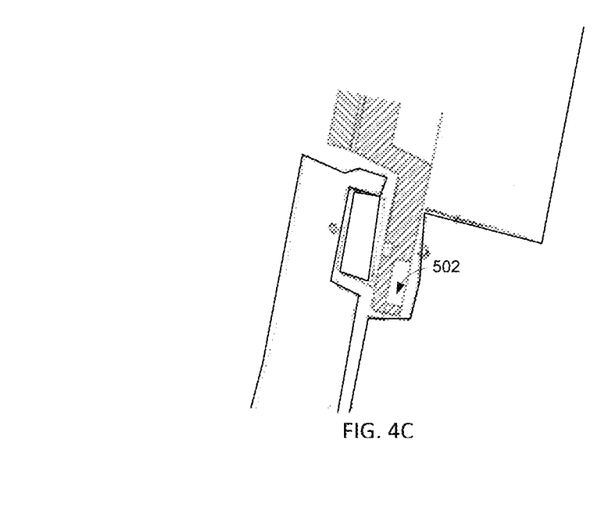
FIG. 4C is cross sectional view of the cavity and tag of FIG. 4A.

It will be appreciated that the tag 504 is positioned in the center of the cavity 502 so as to allow proper communication with an associated RFID reader (not shown) of a deposition chamber of an associated vapor deposition machine (not shown). According to one exemplary embodiment, the tag 504 is secured within the cavity 502 using a suitable epoxy substantially encapsulating the tag 504. In such an embodiment, the encapsulant may be an ultraviolet (UV) curable epoxy, silicone, acrylic, cyanoacrylate, anaerobic, etc. The encapsulant may be implemented as a suitable resin that cures at a predetermined temperature without impacting the sputtering target, e.g., less than or equal to 100° C.

In varying embodiments, the encapsulant is transparent to the visual spectrum. In other embodiments, the encapsulant may be opaque in the visual spectrum. It will be appreciated that the type of encapsulant, as defined above, may be selected in accordance with the composition of the backing plate 500, as different substrates may impact the selection of the appropriate encapsulant material. Furthermore, it will be appreciated that one stage, two stage (e.g. resin and catalyst), etc., materials may be utilized as the encapsulant to substantially encapsulate the RFID tag 504 within the cavity 502 and secure the tag 504 to the backing plate 500.

According to one embodiment, the encapsulant is transparent to the sending and receiving of wireless communications from and by the RFID tag 504. That is, the epoxy allows bidirectional wireless communications between an external device and the RFID tag 504 encased therein. In another embodiment, the encapsulant is configured and formulated to maintain shape and properties while the sputtering target is in use, e.g., normal operating temperatures from 40° C. to 65° C. According to one embodiment, an amount of the encapsulant is deposited such that the top of the encapsulant is flush with the material of the backing plate. In other embodiments, the amount of encapsulant deposited is such that the top of the encapsulant is within 2 to 3 mm of the bottom of the backing plate. It will be understood that the use of the encapsulant not only prevents water or other environmental damage to the RFID tag 504, but also fixes the tag 504 in the exact position required for operability with suitable machinery utilizing sputtering targets and RFID technology.

In accordance with one embodiment, the RFID tag 504 includes memory (not shown), which stores information relating to the sputtering target to which it is affixed. In such an embodiment, the information may include, for example and without limitation, physical characteristics of the target, material type, power specifications, authorization information for use in particular machinery, and the like. It will be appreciated that an associated deposition machine may utilize the aforementioned exemplary information to perform appropriate physical vapor deposition operations using the target to which the RFID tag 504 is affixed.

Figure 5:
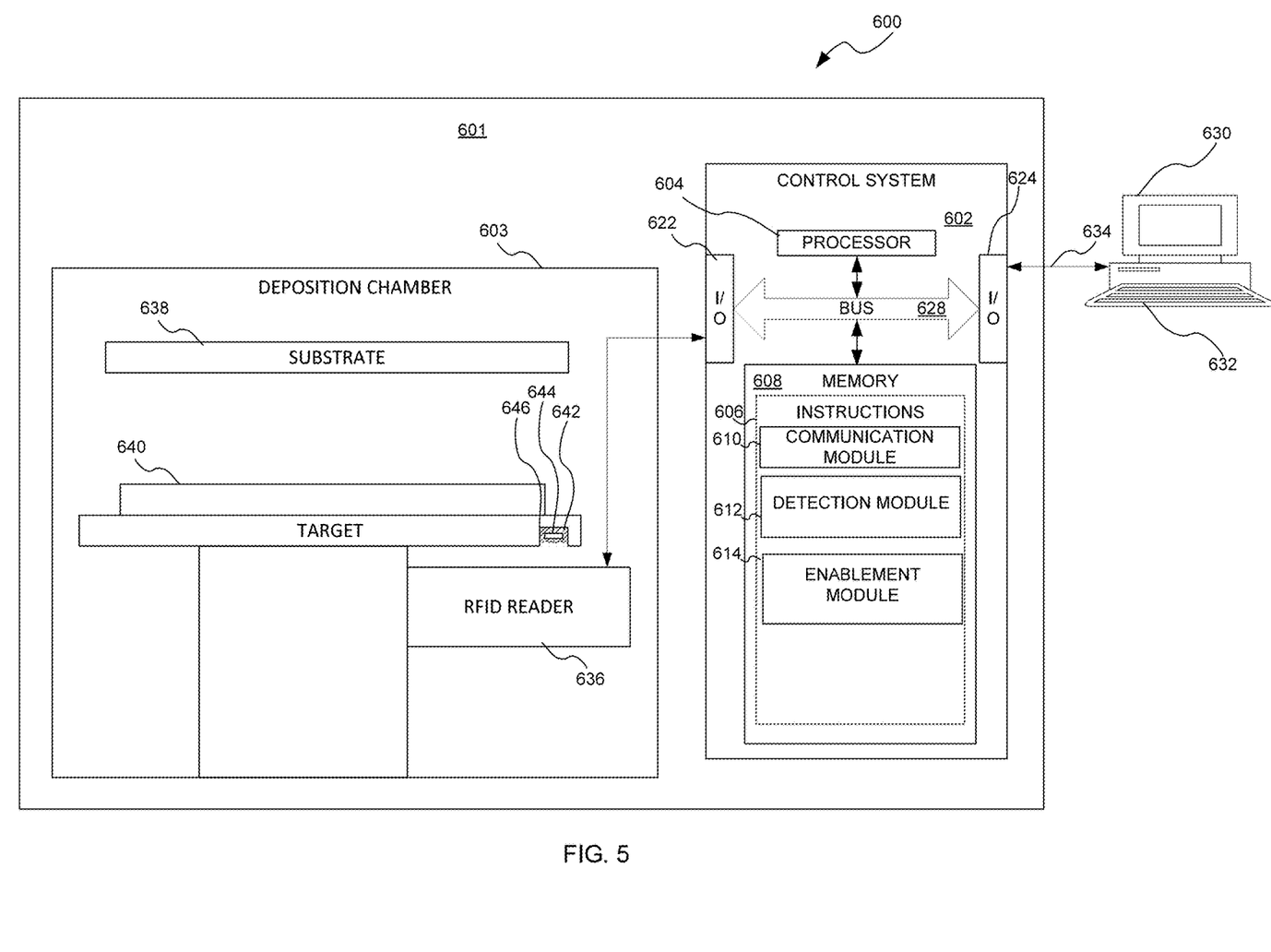
FIG. 5 is a block diagram illustrating an exemplary system utilizing a sputtering target with an RFID tag affixed thereto in accordance with one embodiment of the subject application.

Turning now to FIG. 5, there is shown a vapor deposition system 600 for utilizing a sputtering target to which an RFID tag is affixed in accordance with one embodiment of the subject application. It will be appreciated that the various components depicted in FIG. 5 are for purposes of illustrating aspects of the exemplary embodiment, and that other similar components, implemented via hardware, software, or a combination thereof, are capable of being substituted therein.

It will be appreciated that the system 600 described hereinafter with respect to FIG. 5 is intended to illustrate varying methods and embodiments utilizing targets 640 with RFID tags 644. Accordingly, it will be appreciated and understood by those skilled in the art that such illustration is one possible implementation, and other embodiments, although not illustrated in FIG. 5 are contemplated in accordance with the subject application disclosed herein.

As shown in FIG. 5, the system 600 includes a control system 602 configured to interact with a plurality of devices, components, and the like, as further illustrated herein. As illustrated in FIG. 5, the control system 602 is a component of a physical vapor deposition machine 601 and in operative communication with the deposition chamber 603, e.g., physical vapor deposition chamber, chemical vapor deposition chamber, etc. The exemplary control system 602 includes a processor 604, which performs the exemplary method by execution of processing instructions 606 that are stored in memory 608 connected to the processor 604, as well as controlling the overall operation of the control system 602.

The instructions 606 include a communication module 610 that is configured to communicate with a plurality of different devices as will be appreciated by those skilled in the art. As illustrated in FIG. 5, the communication module 610 may be configured to collect information from an RFID reader 636 located within the deposition chamber 603 and in communication with an RFID tag 644 affixed to a sputtering target 640 located therein.

The instructions 606 may also include a detection module 612 that is configured to analyze the information collected from the RFID tag 644 so as to determine the characteristics of the sputtering target 640. According to one embodiment, the detection module 612 is configured to detect authorized or compatible sputtering targets for use in the associated deposition machine 601. In varying embodiments contemplated herein, the detection module 612 may compare information retrieved from the RFID tag 644 to stored information indicating the type of target authorized/compatible for use in the machine 601. In other embodiments, the information from the RFID tag 644 may be analyzed by the detection module 612 to determine the life of the target remaining. In some such embodiments, the detection module 612, after use of the target 640, may via the communication module 610, update a life remaining (e.g., number of uses, etc.) of the target 640 to the affixed RFID tag 644. Those skilled in the art will appreciate that such a detection module 612 may be implemented as any of a myriad of hardware, software, or combination embodiments.

The instructions 606 may further include an enablement module 614, configured to receive an output from the detection module 612 and enable operations of the vapor deposition machine 601 responsive to a determination that the sputtering target 640 is authorized or compatible for use therein. It will be understood that the analysis module 614 shown in the computer system 602 of FIG. 5.

The various components of the emergency response computer system 602 may all be connected by a data/control bus 628. The computer system 602 may include one or more input/output (I/O) interface devices 622 and 624 for communicating with external devices. The I/O interface 624 may communicate, via communications link 634, with one or more of a display device 630, for displaying information, such estimated destinations, and a user input device 632, such as a keyboard or touch or writable screen, for inputting text, and/or a cursor control device, such as mouse, trackball, or the like, for communicating user input information and command selections to the processor 604. A suitable communications link 634 may include, for example, the public switched telephone network, a proprietary communications network, infrared, optical, or other suitable wired or wireless data communications.

It will be appreciated that the system 600 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or the any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Furthermore, while depicted in FIG. 5 as a networked set of components, the system and method are capable of implementation on a stand-alone device adapted to perform the methods described herein.

The control system 602 may include a computer server, workstation, personal computer, programmable logic controller, glide station, cellular telephone, tablet computer, pager, combination thereof, or other computing device capable of executing instructions for performing the exemplary method.

According to one example embodiment, the control system 602 includes hardware, software, and/or any suitable combination thereof, configured to interact with an associated user, a networked device, networked storage, remote devices, or the like.

The memory 608 may represent any type of non-transitory computer readable medium such as random access memory (RAM), read only memory (ROM), magnetic disk or tape, optical disk, flash memory, or holographic memory. In one embodiment, the memory 608 comprises a combination of random access memory and read only memory. In some embodiments, the processor 604 and memory 608 may be combined in a single chip. The network interface(s) 622, 624 allow the computer to communicate with other devices via a computer network, and may comprise a modulator/ demodulator (MODEM). Memory 608 may store data the processed in the method as well as the instructions for performing the exemplary method.

The digital processor 604 can be variously embodied, such as by a single core processor, a dual core processor (or more generally by a multiple core processor), a digital processor and cooperating math coprocessor, a digital controller, or the like. The digital processor 604, in addition to controlling the operation of the control system 602, executes instructions 606 stored in memory 608 for performing the method disclosed herein.

The system 600, as referenced above, includes an associated physical vapor deposition machine 601 functionally communicating with the control system 602. As shown in FIG. 5, the machine 601 includes a deposition chamber 602 in which deposition operations are performed, e.g., thin films are deposited or sputtered upon a substrate 638. Located within the deposition chamber 602, or alternatively positioned in relative proximity to the chamber 602, but not inside (alternate embodiment), is a suitable near-field communications reader, illustrated as the RFID reader 636 in FIG. 5. It will be appreciated by those skilled in the art that the reader 636 may be commercially available units capable of powering unpowered tags, reading powered/unpowered tags, writing to tags, and the like.

Also shown in FIG. 5 is a sputtering target 640, positioned in the deposition chamber 603 opposite or near a substrate 638, e.g., wafer, film, foil, etc. to be coated via deposition. The target 640 depicted in FIG. 5 corresponds to a planar type sputtering target, but the skilled artisan will appreciate that the illustration of a planar type target 640 in FIG. 5 is intended for example purposes only, and other target shapes, depending upon the capabilities of the associated machine 601 may be used. The target 640 includes a cavity 642 in which an RFID tag 644 is affixed. The tag 644 is affixed via a suitable epoxy 646, as discussed in greater detail above, and as exemplified in the experimental results set forth below.

During operations of the vapor deposition machine 601, as discussed above, the reader 636 communicates with the tag 644 in accordance with instructions received from the control system 602. Upon validation/verification that the sputtering target 640 to which the RFID tag 644 is affixed is able to be utilized for sputtering the substrate 638, the control system 602 functions to the perform the vapor deposition operation as will be understood by those skilled in the art.

EXPERIMENTAL RESULTS

A plurality of encapsulants, including epoxies, suitable for the environment in which the RFID tag would be exposed were researched. Accordingly, the temperature, curing time, hardness, push-off strength, thermal expansion coefficient, viscosity, and maximum operating temperature for each of the plurality of encapsulants were analyzed. Using this analysis, two grades of UV curable epoxy based on their ideal characteristics were selected. These grades (A and B) were used for a two phase Design of Experiments (DOE).

The experiment started with the design and machining of epoxy cavities in various metals such as Aluminum 6061, Copper, etc. This cavity was designed to allow centering of the RFID tag and the ability to completely submerge the RFID tag in the epoxy. The Phase 1 DOE was set up to study the effect of two variables on the final cure of the epoxy: distance from UV light and time under UV light. For this experiment, the UV light's power and intensity was fixed at a proprietary amount.

The RFID tags were affixed to the bottom of the cavity using industrial, double-sided tape while ensuring the tag is centered within both X and Y dimensions of the cavity and correctly orientated for optimum read and write transmission.

A half-factorial DOE was setup and 11 runs for each epoxy were performed in order to study the final curing effects on the epoxy. Approximately 2 cc of epoxy was applied on top of the RFID tag in the cavity to ensure complete coverage while maintaining a height flush with the top of the backing plate material. The aforementioned application used a graduated syringe to measure out the correct amount of epoxy. The fixture was then placed at a predetermined distance from the UV light based on the DOE run that was being followed. The UV light was then turned on for a predetermined amount of time (in minutes) based on the DOE run that was being followed. Effectiveness of cure was tested by measuring the flow, if any, of the epoxy after the cure as well as applying an equal amount of force to the surface of the epoxy to observe if any impression or displacement occurred. If either of the latter existed, the epoxy was considered "uncured".

Once the Phase 1 DOE was complete, a Phase 2 DOE focused on increasing the efficiency of the curing process for production via reduction of the amount of total curing cycle time to be production friendly. During this phase, a fixture was designed to make inserting the RFID tag into the cavity an easy and repeatable process. This phase further held a repeatability study to ensure RFID tag read and write abilities are fully optimized.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:
1. A sputtering target, comprising:
a backing plate including a cavity;
an RFID tag positioned within the cavity; and
radio frequency transparent ultraviolet curable epoxy or a radio frequency transparent ultraviolet curable silicone encapsulant substantially encapsulating the RFID tag within the cavity.
2. The sputtering target of claim 1, wherein the cavity is located adjacent an outer circumference of a bottom of the backing plate, and wherein the RFID tag is centered with the cavity.
3. The sputtering target of claim 2, wherein the RFID tag is positioned on a bottom of the cavity.
4. The sputtering target of claim 2, wherein the RFID tag is positioned within the cavity having an air gap in an X direction in the range of 2 to 3 mm, and positioned within the cavity having an air gap in a Y direction in the range of 2 to 3 mm.
5. A backing plate for a sputtering target, comprising:
a cavity formed adjacent an outer circumference of a bottom of the backing plate;
an RFID tag positioned on a bottom of the cavity, wherein the RFID tag is centered within the cavity; and a radio frequency transparent ultraviolet curable epoxy or a radio frequency transparent ultraviolet curable silicone encapsulant substantially encapsulating the RFID tag within the cavity.

6. The backing plate of claim 5, wherein a top of the encapsulant is flush with the bottom of the backing plate.

7. The backing plate of claim 6, wherein the RFID tag is positioned within the cavity having an air gap in an X direction in the range of 2 to 3 mm, and an air gap in a Y direction in the range of 2 to 3 mm.

8. A sputtering target backing plate comprising an RFID tag substantially encapsulated within a cavity formed thereon, wherein the RFID tag is substantially encapsulated via radio frequency transparent encapsulant allowing bidirectional wireless communications between an external device and the RFID tag, wherein the radio frequency transparent encapsulant is selected from the group comprising an ultraviolet curable epoxy, an ultraviolet curable silicone, a heat curable epoxy, a heat curable silicone, or a two stage curable epoxy.

\* \* \* \* \*